United States Patent [19]
Hori

[11] Patent Number: 4,833,643
[45] Date of Patent: May 23, 1989

[54] ASSOCIATIVE MEMORY CELLS

[75] Inventor: Chikahiro Hori, Kanagawa, Japan

[73] Assignee: Kabushiki Kaisha Toshiba, Kawasaki, Japan

[21] Appl. No.: 941,772

[22] Filed: Dec. 15, 1986

[30] Foreign Application Priority Data

Jan. 17, 1986 [JP] Japan .................... 61-6383

[51] Int. Cl.[4] ............................. G11C 15/00
[52] U.S. Cl. ..................... 365/49; 365/190
[58] Field of Search ............... 365/49, 154, 190

[56] References Cited

U.S. PATENT DOCUMENTS

| | | | |
|---|---|---|---|
| 3,969,707 | 7/1976 | Lane et al. ............... | 365/49 |
| 3,971,004 | 7/1976 | Dingwall ................. | 365/156 |
| 4,467,451 | 8/1984 | Moyer .................... | 365/156 |
| 4,558,434 | 12/1985 | Baba et al. .............. | 365/189 |
| 4,646,271 | 2/1987 | Uchiyama et al. .......... | 365/49 |

FOREIGN PATENT DOCUMENTS

| | | | |
|---|---|---|---|
| 175603 | 3/1986 | European Pat. Off. ........... | 365/49 |
| 2609714 | 12/1977 | Fed. Rep. of Germany . | |
| 60-236195 | 11/1985 | Japan ........................ | 365/49 |
| 84/01079 | 7/1984 | PCT Int'l Appl. . | |

OTHER PUBLICATIONS

Hiroshi Kodata et al. "An 8kb Content-Addressable and Reentrant Memory". ISSCC Digest of Technical Papers, pp. 42≧43; Feb. 1985.

*Primary Examiner*—Joseph A. Popek
*Attorney, Agent, or Firm*—Foley & Lardner, Schwartz, Jeffery, Schwaab, Mack, Blumenthal & Evans

[57] ABSTRACT

Associative memory cell with low power consumption and capable of performing a high speed operation in which MOS transistors of a first conductive type constituting transfer gates for transferring data between data hold circuit and bit lines those of opposite conductive type constituting a *data* retrieval circuit are used, so that the data stored in the data hold circuit can be read out stably and securely, as well.

4 Claims, 7 Drawing Sheets

ASSOCIATIVE MEMORY CELLS

BACKGROUND OF THE INVENTION

(1) Field of the Invention

The present invention relates to associative memory cells for associative memory devices, particularly to improved associative memory cells of low power consumption and capable of performing a high speed operation.

(2) Description of the Prior Art

With developments of recent electronic techniques, memory devices having various function are coming into wide use for electronic devices. An associative memory device is one such device.

FIG. 1 shows the construction of CMOS static associative memory cell according to the prior art (see, ISSCC-International Solid State Circuit Conference, Feb. 13, 1985, pp 42-43). The memory associative cell consists of a memory cell portion 101 for performing a normal storing function and an exclusive NOR portion 103 indicated as E.NOR in FIG. 1, which performs an Associative operation.

The cell portion 101 further comprises two CMOS inverter circuits connected so as to perform a flip-flop function and transfer gates 105 and 107 of N-channel MOS transistors (which are referred to hereinafter as NMOS transistors) which transfer data between each inverter circuit and each of bit lines BL and $\overline{BL}$, each gate electrode thereof being connected to a word line WL.

The exclusive NOR portion 103 consists of NMOS transistors connected so as to construct wired AND circuits. In the associative memory cell thus constructed, when data retrieval operation as a basic function of the associative memory should be performed, the bit lines BL and $\overline{BL}$ are preliminarily maintained a low level prior to the retrieval operation and a sense line SE is precharged to a power supply voltage $V_{DD}$.

With this condition, the retrieval data or data and its inverted retrieval data in polarity are supplied to the bit lines BL and $\overline{BL}$ which have been predischarged to the ground level, i.e., OV, respectively. When the retrieval data on the bit lines BL and $\overline{BL}$ coincides with the stored data in the memory cell portion 101, the sense line SE is maintained at the voltage $V_{DD}$, otherwise it is discharged to the low level, i.e., OV. This means that same data as the retrieval data has been stored in the memory cell connected to the sense line SE.

Furthermore, when the data stored in the cell portion 101 should be read out on the bit lines BL and $\overline{BL}$, the bit lines are precharged to the power supply voltage $V_{DD}$ preliminarily, prior to the normal read operation. After the precharge of the bit lines BL and $\overline{BL}$ has been terminated, the word line WL connected to each gate electrode of the transfer gates 105 and 107 is maintained at the high level. The transfer gates 105 and 107 are then rendered conductive and the data stored in the memory cell portion 101 is read on the bit lines BL and $\overline{BL}$ through the gates 105 and 107.

In this manner as described, the potentials of the bit lines BL and $\overline{BL}$ prior to the start of the read operation are precharged to the power supply voltage $V_{DD}$, while the bit lines BL and $\overline{BL}$ prior to the start of the retrieval operation are predischarged to the ground level. Namely, every time the operation mode of the associative memory is changed, the bit lines BL and $\overline{BL}$ are precharged or predischarged to the voltage $V_{DD}$ or to the ground level. As a result, electric power and the operation time for performing the precharge and predischarge are both required, thereby preventing the associative memory from being low power consumption as well as from performing at a high speed operation.

Even when the bit lines BL and $\overline{BL}$ are not precharged to the voltage $V_{DD}$, but are predischarged to the ground level before starting the read operation, the data stored in the memory cell portion 101 can be read out. In this case, however, if the stored data having the high level is read out on the bit lines BL and $\overline{BL}$ from the output terminal of the inverter circuit through the transfer gate 105, the transfer gate 105 is rendered non-conductive when the voltage of the bit lines BL and $\overline{BL}$ are increased from the ground level (normally OV) to $V_{DD}$-$V_T$ level (where $V_T$ indicates a threshold voltage of each of the NMOS transistors) because of the characteristics of the NMOS transistors as transfer gates.

Moreover, the increase in the source potential of the transfer gate 105 causes $V_T$ to be large because of so-called "back gate bias effect." This will prevent the potential of each of the bit lines BL and $\overline{BL}$ from increasing up to the necessary potential for sufficiently carrying out the read operation.

When further increase in the potentials of the bit lines causes the potential difference between the source and drain of the transfer gate 105, the speed of the potential increase of the bit lines becomes delayed. This in turn results in the delay in reading out the data from the memory cell portion 101 onto the bit lines BL and $\overline{BL}$, thereby inviting a degradation in the characteristic of the read data due to the slow speed in the read operation.

Accordingly, when the read operation is performed with the bit lines BL and $\overline{BL}$ being predischarged to the ground level prior to the read operation, the precharge of the bit lines BL and $\overline{BL}$ can be dispensed with, for every operation mode. However, the circuit design must take into consideration degradation of the characteristic, thus making a large operating margin difficult.

SUMMARY OF THE INVENTION

It is an object of the present invention therefore, to provide associative memory cells with low power consumption and capable of performing a high speed operation as well as performing a stable and secured read-/write operation.

It is another object of the present invention to provide associative memory cells in which MOS transistors of one conductive type and MOS transistors of the opposite type are used for transfer gates and for an data retrieval circuit so that the data stored in a data hold circuit can be read at high speed, as well as writing it in the hold circuit.

One feature of the present invention resides in an associative memory cell which comprises: a first MOS transistor of a first conductive type connected to one of bit lines at a first terminal thereof and conductively controlled by a potential of a word line through a second terminal; a second MOS transistor of the first conductive type connected to the other of the bit lines at one terminal thereof and conductively controlled by the potential of the word line through a second terminal thereof; an data hold circuit connected between third terminals of the first and second MOS transistors for storing data therein through each of the first and second MOS transistors; and an data retrieval circuit having a first pair of MOS transistors of a second conductive type connected in series between one terminal of the data hold circuit and the one of the bit lines and a second pair MOS transistors of the second conductive type connected in series between the other of the bit lines, thereby maintaining the potential of a match line either at a first potential level when a match occurs between the data applied to the bit lines and the stored data or releasing to a second potential level when a match does not occur therebetween.

These and other objects, advantages and features of the present invention will be better understood from the following detailed description of the invention with reference to the accompanying drawings.

DESCRIPTION OF THE PREFERRED EMBODIMENT

Figure 2:
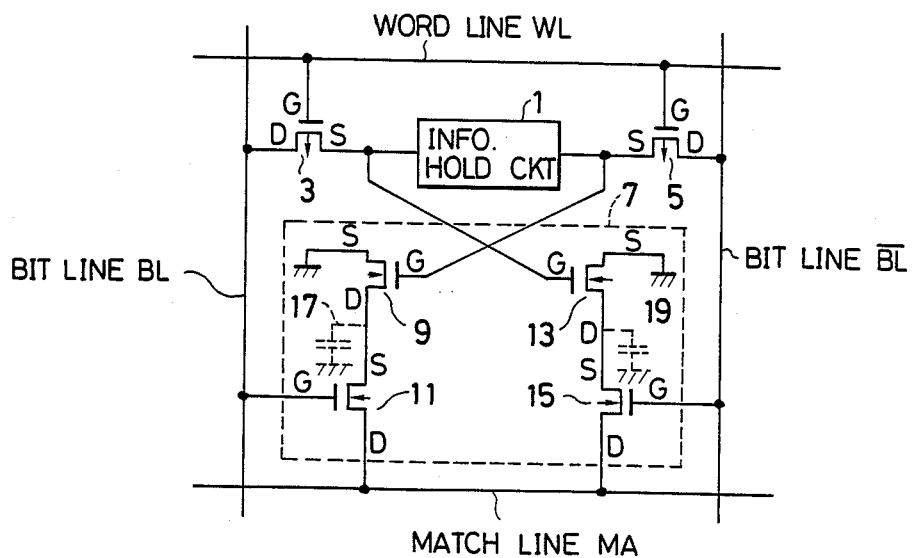
FIG. 2 is a first embodiment of the associative memory cell according to the present invention.

Referring to FIG. 2, the associative memory cell according to the present invention comprises an data hold circuit 1, transfer gates 3 and 5, a retrieval circuit 7, a word line WL, bit lines BL and $\overline{BL}$, a match line MA.

The data hold circuit 1 is connected to the bit lines BL and $\overline{BL}$ through the transfer gates 3 and 5. Data supplied on the bit line BL and its complementary data supplied on the bit line $\overline{BL}$ are stored in the data hold circuit 1 in the write operation. The data stored in the data hold circuit 1 is read out on the bit lines BL and $\overline{BL}$ through the transfer gates 3 and 5 in the read operation.

P-channel MOS transistors (referred to hereinafter as PMOS transistors) are used as the transfer gates 3 and 5. The gate electrodes of the transfer gates are connected to the word line WL and they are rendered conductive or non-conductive by a signal on the word line WL and they transfer data between the data hold circuit 1 and the bit lines BL and $\overline{BL}$.

The retrieval circuit 7 of comprises of N-channel MOS transistors which are also referred to hereinafter as NMOS transistors. The gate electrode of the NMOS transister 9 is connected to the source electrode of the transfer gate 5, its source electrode is connected to the ground, and its drain electrode is connected to the source of the NMOS transistor 11. The gate of the NMOS transistor 11 is connected to the bit line BL and its drain is connected to the match line MA.

The gate electrode of the NMOS transistor 13 is connected to the source of the transfer gate 3, its source is connected to the ground, and its drain is connected to the source of the NMOS transistor 15. The gate of the NMOS transistor 15 is connected to the bit line $\overline{BL}$ and the drain thereof is connected to the sense line MA.

The read write operation of the associative memory cell thus constructed will now be described.

In the data retrieval operation, the bit lines BL and $\overline{BL}$ are precharged to the ground potential, which is normally 0 volts before starting the retrieval operation. Then, the bit lines BL and $\overline{BL}$ are predischarged and the match line MA is in turn precharged to the power supply voltage $V_{DD}$. When low level data is stored in the data hold circuit 1, the gate of the NMOS transistor 9 is supplied with a high level signal, while the NMOS transistor 13 is supplied with a low level signal so that the NMOS transistor 9 is rendered conductive while the NMOS transistor 13 is rendered non-conductive.

Retrieval data is applied to the bit line BL, with the bit line BL and $\overline{BL}$ predischarged and the match line MA precharged, while its inverted retrieval data is applied to the bit line $\overline{BL}$. The retrieval operation is performed in this condition. For instance, when high level retrieval data is applied to the bit line BL, while low level inverted retrieval data is applied to the bit line $\overline{BL}$, the gate of the NMOS transistor 11 switches to the high level condition and the transistor 11 is rendered conductive. As a result, current flows from the match line MA to the ground through the transistors 11 and 9 and the potential of the match line MA becomes ground potential.

On the other hand, when low level retrieval data is applied to the bit line BL while high level inverted retrieval data is applied to the bit line $\overline{BL}$, the gate of the NMOS transistor 11 switches to the low level condition while the gate of the NMOS transistor 15 becomes high level condition. As a result, the transistor 11 is rendered non-conductive while the transistor 15 is rendered conductive and the potential of the match line MA is maintained at the power supply voltage $V_{DD}$. Consequently, when the retrieval data coincides with the stored data in the data hold circuit 1, the potential of the match line MA is maintained at the voltage $V_{DD}$, while when the match condition does occurs, the potential of the match line becomes ground potential. In this manner as described, the data retrieval operation is carried out by retrieving the stored data which coincides with the retrieval data.

In the write operation, the bit lines BL and $\overline{BL}$ are predischarged to the ground potential. When the word line WL is supplied with a low level signal in that condition so as to render the transfer gates 3 and 5 conductive data to be written and its inverted data are applied to the bit lines BL and $\overline{BL}$ and they are written into the data hold circuit 1 through the transfer gates 3 and 5.

In the read operation, the bit lines BL and $\overline{BL}$ are predischarged to 0 V and the data stored in the data hold circuit 1 are read out on the bit lines BL and $\overline{BL}$ through the gates 3 and 5 to an output circuit not shown. In this read operation, since the transfer gates 3 and 5 are realized by PMOS transistors, each of the gate electrodes are rendered conductive in a low level condition. Accordingly, when the data at the potential $V_{DD}$ is to be read out on the bit line BL from the data hold circuit 1 through the transfer gate 3, the potential difference between the gate electrode and the source electrode or the gate electrode and the drain electrode is always above a threshold voltage of the transfer gate 3. As a result, if the gate electrode of the transfer gate 3 is in the low level condition, the transfer gate 3 is rendered conductive, regardless of the potential on the bit line BL. Accordingly, when the data at $V_{DD}$ is read out of the data hold circuit 1 onto the bit line BL through the transfer gate 3, the bit line BL is securely risen to $V_{DD}$ potential from the ground potential, thus performing the read operation accurately and stably.

As described in the foregoing, the use of the PMOS transistors as the transfer gates enables the bit lines BL and $\overline{BL}$ to securely rise to $V_{DD}$ potential in the read operation, so as to perform the read operation stably. Consequently, it becomes possible to start the data retrieval, read, and write operations in the predischarged condition of the bit lines BL and $\overline{BL}$.

Figure 3:
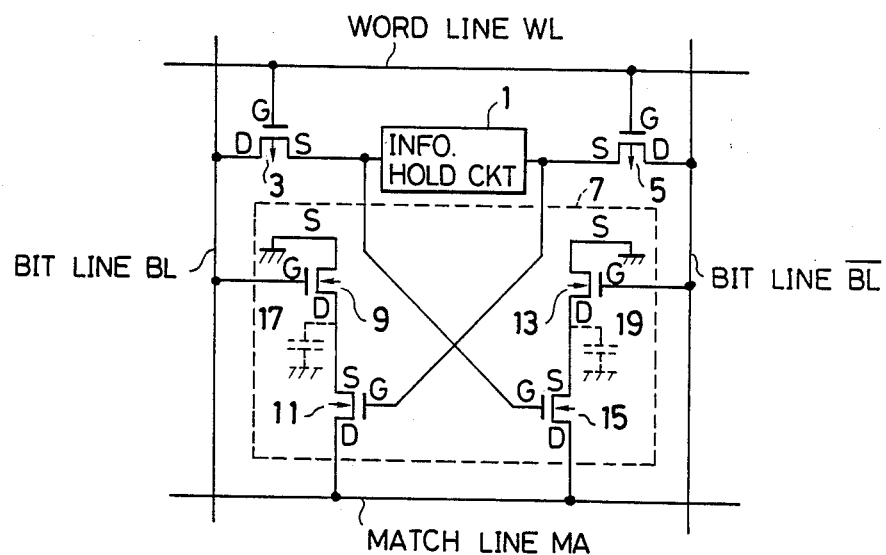
FIG. 3 is a second embodiment of the associative memory according to the present invention.

FIG. 3 shows the contruction of a second embodiment of the associative memory cell according to the present invention. The associative memory cell shown in FIG. 3 has overcome the following disadvantages of the first embodiment of FIG. 2.

Figure 1:
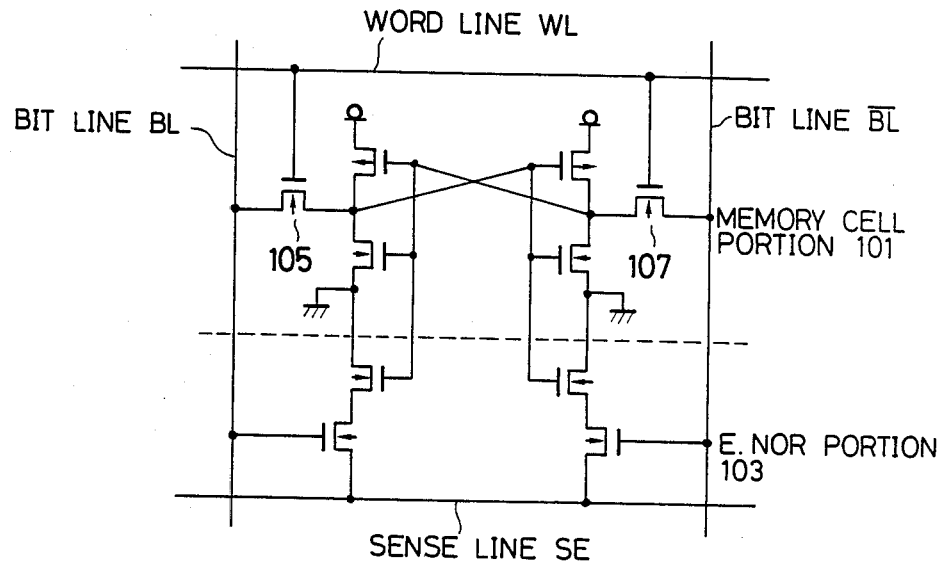
FIG. 1 is the associative memory cell according to the prior art.

Namely, in the associative memory cell of FIG. 1, when the retrieval data and its inverted retrieval data are applied to each of the bit lines BL and $\overline{BL}$ in the retrieval operation, either the NMOS transistor 11 the gate electrode of which is connected to the bit line BL, or the NMOS transistor 15 the gate electrode of which is connected to the bit line $\overline{BL}$ is rendered conductive. As a result, even when the retrieval data coincides with the stored data, part of the electric charge stored in the match line MA which has been precharged prior to the retrieval operation, flows through the NMOS transistor 11 in the conductive condition or through the NMOS transistor 15 into a capacitor 17 or a capacitor 19 which were formed at the junction between the drain electrode of the NMOS transistor 9 and the source electrode of the NMOS transistor 11 as well as the junction between the drain electrode of the NMOS transistor 13 and the source electrode of the NMOS transistor 15 during the manufacturing process of the MOS transistors. As a result, the potential on the match line MA is decreased and malfunction will occur.

In the associative memory cell shown in FIG. 3, the potential of the match line MA is prevented from lowering when a match occurs between the retrieval data and the stored data.

To this end, the gate electrodes of the NMOS transistors 9 and 13 are connected to the bit lines BL and $\overline{BL}$ while each gate electrode of the NMOS transistors 11 and 15 is connected to each source electrode of the transfer gates 3 and 5, which constitute the retrieval circuit 7 of the associative memory cell.

With this construction, when low level data, for instance, has been stored in the data hold circuit 1, the NMOS transistor 11 is in the conduct condition so that when the match line MA is precharged to the power supply voltage, the capacity 17 is also charged at the same time. Accordingly, even when the NMOS transistor 11 is rendered conductive as the result of application of low level retrieval data and a match occurs between the retrieval data and the stored data, the electric charge no longer flows through the NMOS transistor 11 into the capacity 17 from the match line MA which has been precharged, thereby permitting the match line MA to maintain the $V_{DD}$ potential.

Furthermore, when high level data has been stored in the data hold circuit 1 and a match occurs between the retrieval data and the stored data as the result of application of the low level retrieval data on the bit line $\overline{BL}$, the $V_{DD}$ potential can be maintained at the sense line MA as is appreciated from the above description.

The retrieval, read, and write operations of the associative memory cell shown in FIG. 3 are similarly performed in the case of the memory cell shown in FIG. 2. In FIG. 3, the same elements as those of FIG. 2 are indicated by the same reference numerals.

Figure 4:
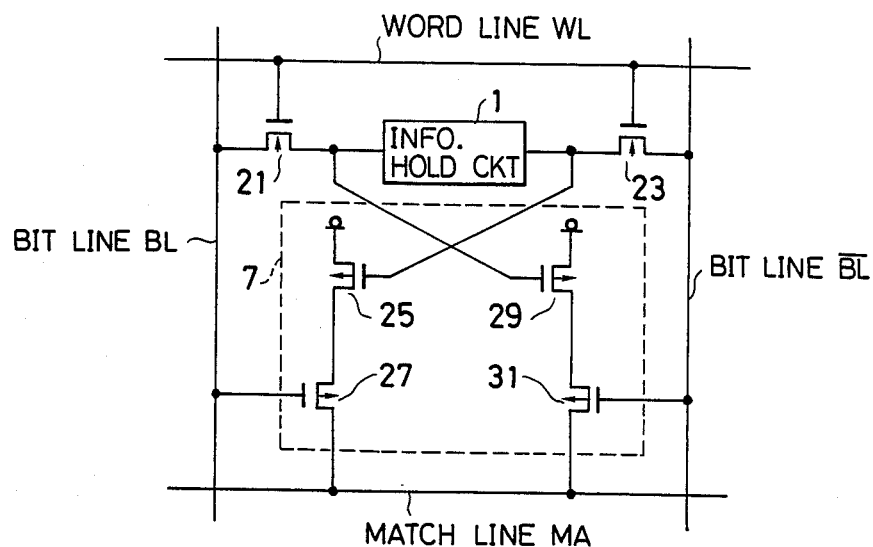
FIG. 4 is a third embodiment of the associative memory cell using other conductive type MOS transistors for the retrieval circuit, according to the present invention.

FIG. 4 shows another associative memory cell according to the present invention, as a third embodiment.

The associative memory cell of FIG. 4 is comprised of NMOS transistors 21 and 23 corresponding to the transfer gates 3 and 5 for the cell portion and PMOS transistors 25 to 31 corresponding to the NMOS transistors 9 to 15 in FIG. 2 respectively for the retrieval circuit 7 in which the read/write operation can be performed, with the bit line BL and $\overline{BL}$ precharged to the $V_{DD}$ potential. Having bit lines BL and $\overline{BL}$ precharged, and after the PMOS transistors 27 and 31 are rendered non-conductive, the retrieval operation is carried out, with the match line MA predischarged to the ground potential.

With this construction, when the retrieval data does not coincide with the stored data in the retrieval operation, the potential of the match line MA is increased form the ground potential to the $V_{DD}$ potential, while when a match occurs between the two data the potential of the match line MA can be maintained at the ground potential.

In the read/write operation, the transfer gates 21 and 23 are rendered conductive when a high level signal is applied to the word line WL, which is in turn applied to each gate electrode of the transfer gates 21 and 23. As a result, when low level data is to be transferred between the data hold circuit 1 and the bit lines BL and $\overline{BL}$, the transfer gates 21 and 23 are prevented from being conductive. Accordingly, not only high level data but also low level data can be securely transferred by the use of the NMOS transistors as the transfer gates 21 and 23, thereby producing the same effects as those of the memory cell of FIG. 2.

Figure 5:
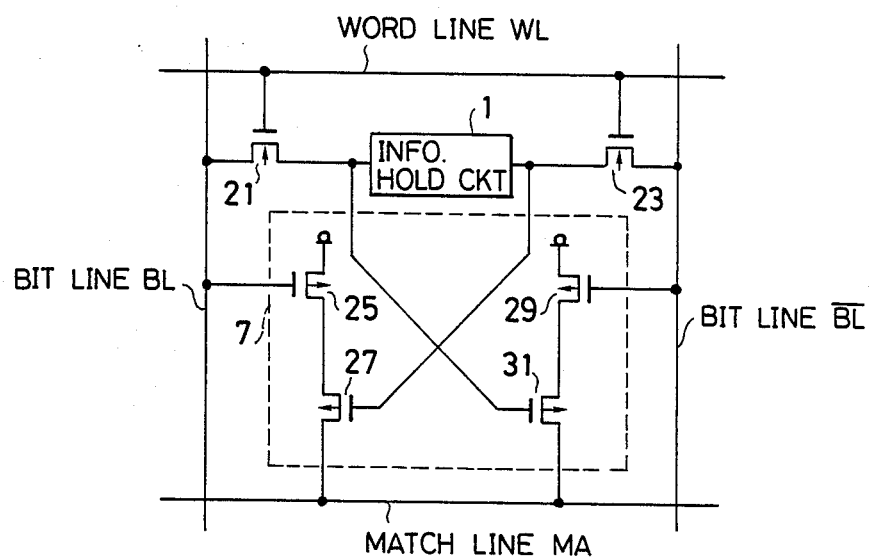
FIG. 5 is a fourth embodiment of the associative memory cell according to the present invention.
Figure 6:
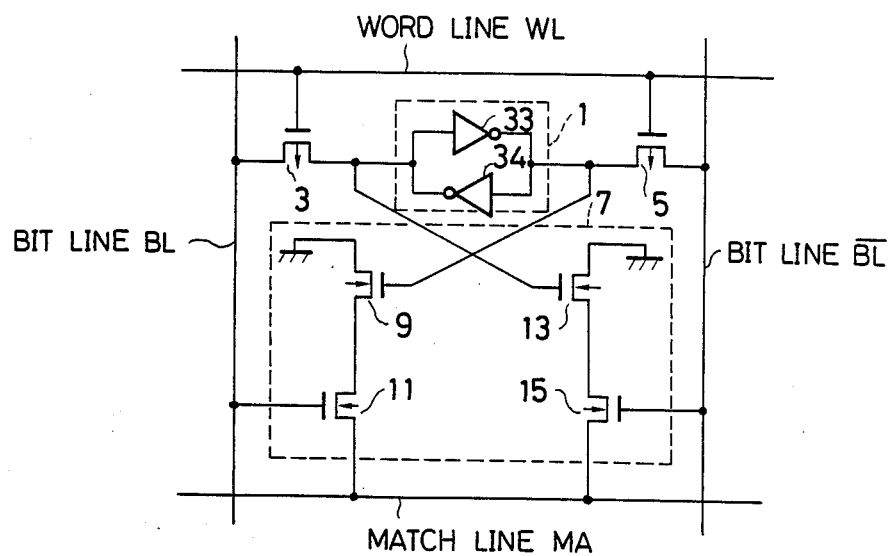
FIG. 6 is a fifth embodiment of the associative memory cell using two inverters connected in parallel, according to the present invention.
Figure 7:
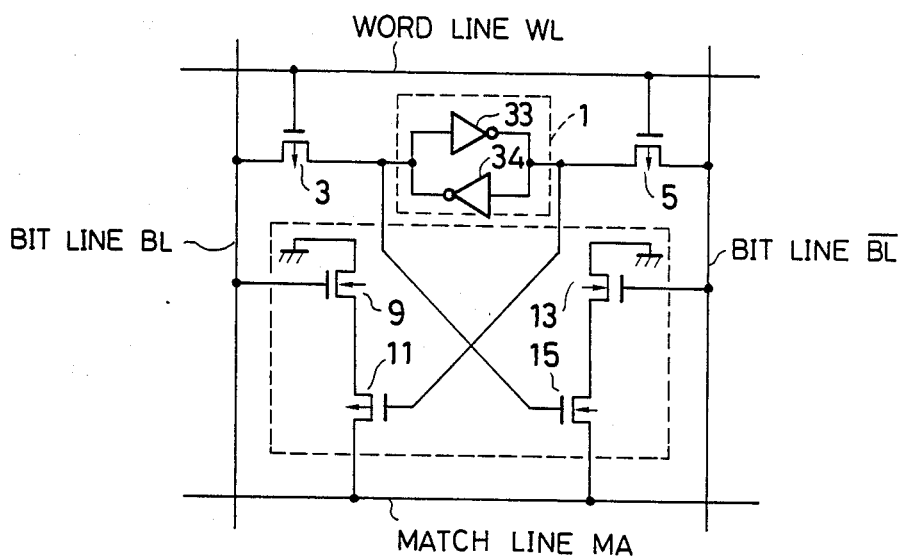
FIG. 7 is a sixth embodiment of the associative memory cell according to the present invention.
Figure 8:
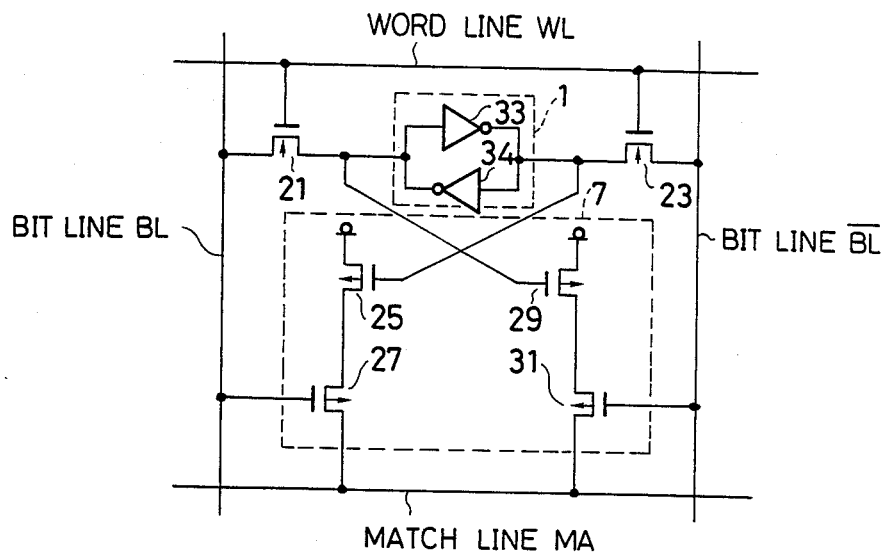
FIG. 8 is a seventh embodiment of the associative memory cell according to the present invention.
Figure 9:
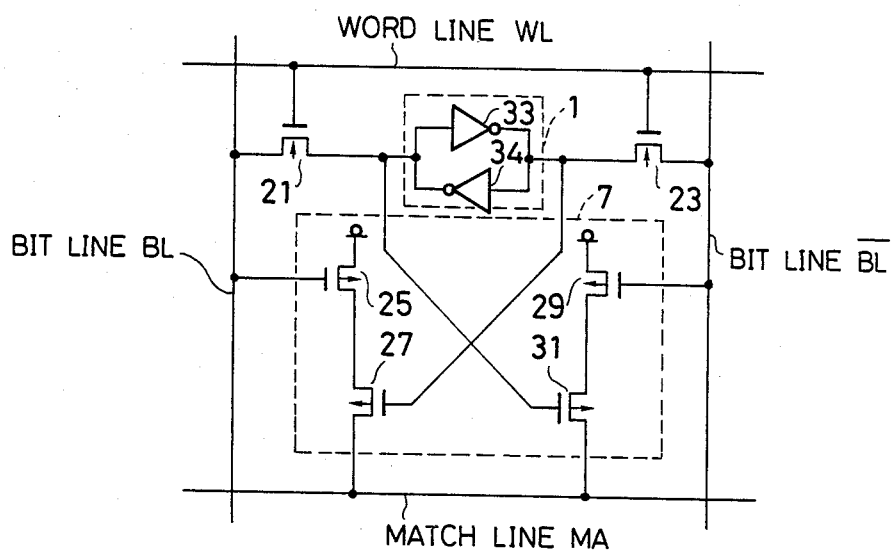
FIG. 9 is a eighth embodiment of the associative memory cell according to the present invention.
Figure 10:
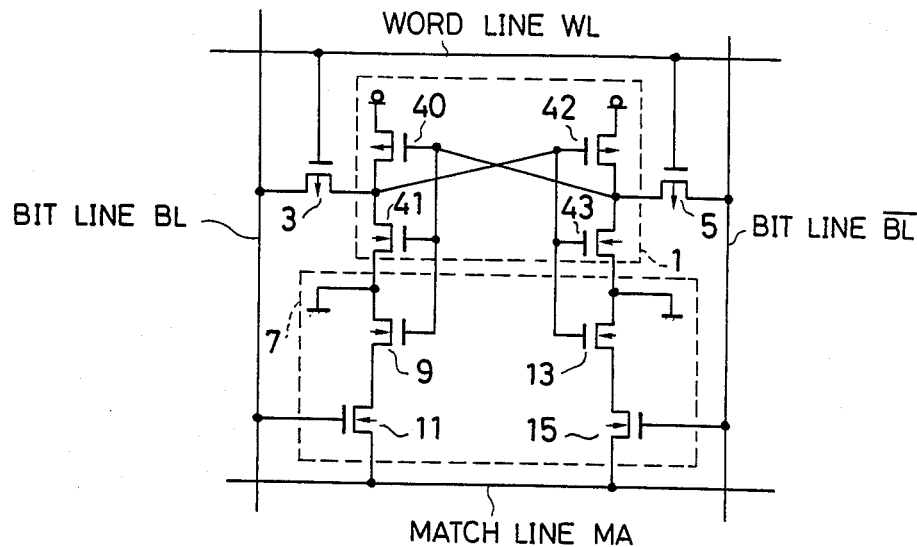
FIG. 10 is ninth embodiment of the associative memory cell having first and second pairs of MOS transistors of different conductive types for a memory cell portion, according to the present invention.
Figure 11:
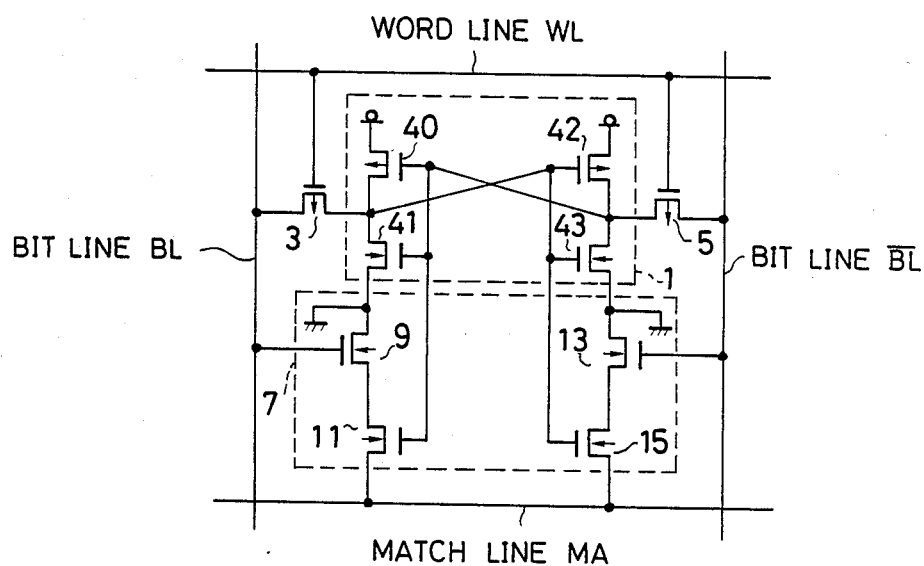
FIG. 11 is a tenth embodiment of the associative memory cell according to the present invention.
Figure 12:
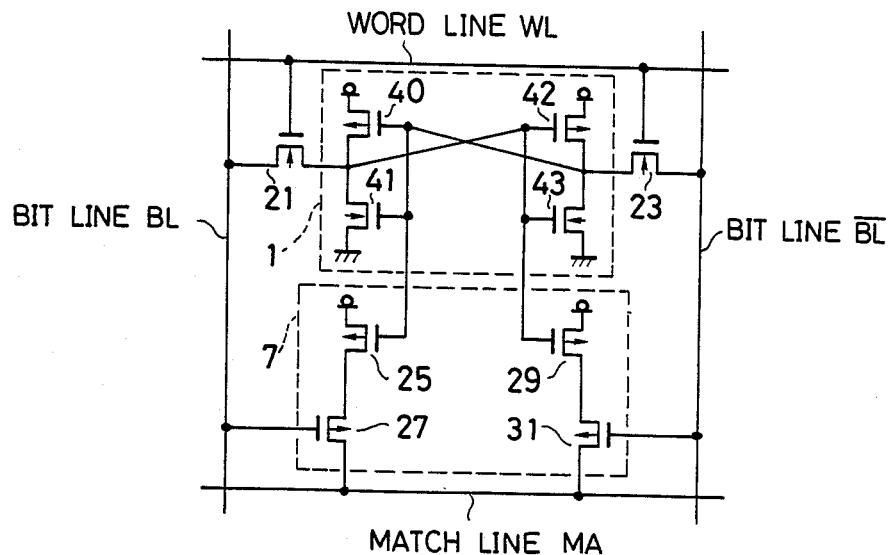
FIG. 12 is an eleventh embodiment of the associative memory cell according to the present invention.
Figure 13:
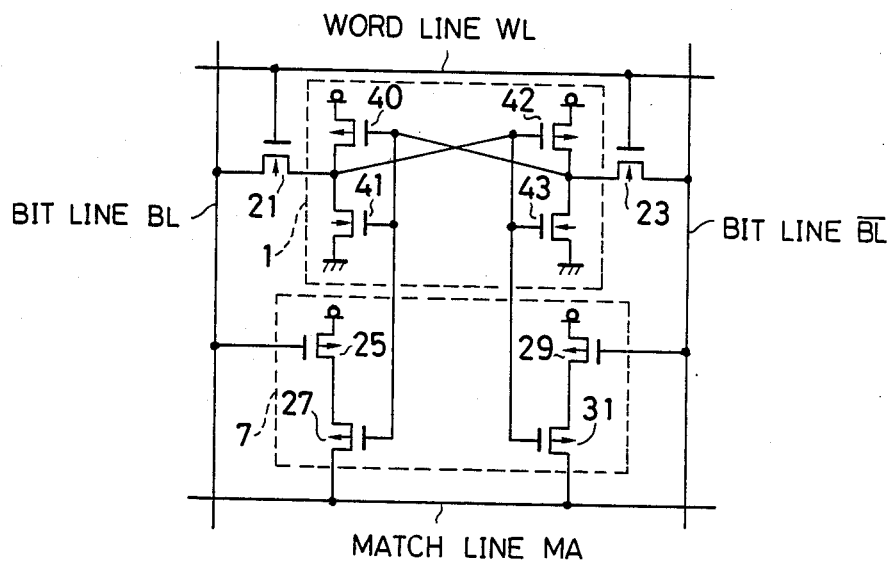
FIG. 13 is a twelveth embodiment of the associative memory cell according to the present invention.

FIG. 5 shows the construction of the associative memory cell as a fourth embodiment according to the present invention. The associative memory cell of this embodiment is comprised of the same constructing elements as those of FIG. 4, except for some difference in its interconnection. Namely, each gates electrode of the NMOS transistors 25 and 29 are connected to the bit lines BL and $\overline{BL}$, instead of the transistors 27 and 31 in FIG. 4.

With this construction, the increase in the potential of the match line MA which otherwise occurs can be prevented, i.e., part of the electric charge stored in the capacitance (not shown) formed at the junction between the drain electrode of the PMOS transistor 25 and the source electrode of the PMOS transistor 27 or in the capacitance (now shown) formed at the junction between the drain electrode of the PMOS transistor 29 and the source electrode of the PMOS transistor 31 flows into the match line MA through the PMOS transistor 27 or 31 which is in the conductive condition when the match condition occurs between the retrieval data and the stored data as in the case of the first embodiment. In FIG. 5, the same reference numerals are attached to the same elements as those in FIG. 4.

FIG. 6 to 9 show each embodiment of the associative memory cell according to the present invention, which corresponds to each of the embodiments already shown and described with reference to FIGS. 2 to 5. Namely, in FIGS. 6 to 9, the data hold circuit 1 includes inverter circuits 33 and 34, with each input terminal and each output terminal of the inverter circuits 33 and 34 connected to each other. The function and the effects of each associative memory cell shown in FIGS. 6 to 9 are same as those of each of the embodiments which have already been described with reference to FIGS. 2 to 5.

FIGS. 10 to 13 show each of another embodiments of the associative memory cells according to the present invention, which also corresponds to each of the embodiments already shown and described with reference to FIGS. 2 to 5. Namely, in FIGS. 10 to 13, the data hold circuit 1 is realized by a plurality of CMOS transistors 40 to 43, i.e., two CMOS transistor inverter circuits which function as a flip-flop circuit. The function of each of the embodiments shown in FIGS. 10 to 13 is same as that of each of the embodiments which have already been described with reference to FIGS. 6 to 9, producing the same effects which have also been described with reference to FIGS. 6 to 9.

As described in the foregoing embodiments of the associative memory cells according to the present invention, MOS transistors of a first conductive type constituting an data retrieval circuit and those of the opposite conductive type constituting the transfer gates for transferring data between an data hold circuit and bit lines are used, so that the data stored in the data hold circuit can be read stably and yet securely.

In addition, since the potentials of the bit lines to be precharged before a retrieval operation is performed by an data retrieval circuit between the stored data in a particular associative memory cell and the data supplied to the bit lines have been made equal to the potentials of the bit lines to be precharged before the write operation of data to the memory cell, as well as performing the read operation of the data from the memory cell, it has become no longer necessary to change the potentials of the bit lines each time before starting the read/write operation. As a result, power consumption of the associative memory cells can be reduced as well as enabling a high speed operation to be performed.

While the invention has been described in its preferred embodiments, it is to be understood that the words which have been used are words of description rather than limitation and that various changes and modification may be made within the purview of the appended claims without departing from the true scope and spirit of the invention in its broader aspects.

What is claimed is:

1. An associative memory cell comprising:
a first MOS transistor of a first conductive type;
a pair of bit lines, said first transistor connected to one of said bit lines at a first terminal thereof;
a word line conductively controlling said first transistor by applying a potential to a second terminal thereof;
a second MOS transistor of said first conductive type connected to said second bit line at one terminal thereof and conductively controlled by the potential of the word line applied to a second terminal thereof;
an information hold circuit connected between a third terminal of each of said first and second MOS transistors, said information hold circuit storing information received from said first and second transistors;
an information retrieval circuit having first and second pairs of MOS transistors of a second conductive type opposite to said first conductive type, said first pair of transistors connected in series at their gate terminals between one terminal of said information hold circuit and one of said bit lines and said second pair of transistors connected in series at their gate terminals between the other terminal of said information hold circuit and said other bit line; and
a match line coupled to output terminals of said information retrieval circuit and prechanged in advance of interrogation of a match to maintain a first potential level of the prechanged condition of said match line when a match occurs between the information applied to a bit line and the stored information and to change said first potential level when such a match does not occur.

2. The associative memory cell of claim 1, in which said first and second transistors are NMOS transistors and said first and second pairs of transistors are PMOS transistors.

3. The associative memory cell of claim 1, in which the gate electrode of the second transistor of the first pair of MOS transistors is connected to one of said bit lines and the gate electrode of the second transistor of the second pair of MOS transistors is connected to the other bit line;
said first and second transistors of the first conductive type being NMOS transistors and said first and second pairs of transistors of the second conductive type being PMOS transistors.

4. An associative memory cell comprising a MOS memory cell coupled to two bit lines through two transfer MOS transistors, respectively, and having two nodes which are only stable in opposite logical states, said MOS memory cell being addressed through a word line which is coupled to the gates of said transfer MOS transistors, an associative circuit consisting of two pairs of MOS transistors, the two transistors of each pair being connected in series between a match line and a terminal kept at one of the logical states, the two gates of one of said pairs being coupled, respectively, to one of said nodes and one of said bit lines, the two gates of the other of said pairs being coupled, respectively, to the other of said nodes and the other of said bit lines, wherein, when the levels of said bit lines coincide with the levels of said nodes, one MOS transistor of each pair is turned off, whereby, after the other logical level is applied to said match line, a match between the levels of said nodes and the levels supplied to said bit lines is signaled in terms of whether the other logical level of said match line is kept or changed to said one logical level, said MOS memory cell being addressed by applying a low voltage level (zero voltage) to said word line which is maintained at an high voltage (positive voltage) level when not addressed, and which is coupled to the gates of said transfer transistors formed with P-channels.

* * * * *